(12) United States Patent
Stong

(10) Patent No.: US 6,895,061 B1
(45) Date of Patent: May 17, 2005

(54) SCANNABLE SYNCHRONIZER HAVING A DECEASED RESOLVING TIME

(75) Inventor: Gayvin E Stong, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/426,990

(22) Filed: Oct. 26, 1999

(51) Int. Cl.$^7$ ............................................. H04L 7/00
(52) U.S. Cl. ...................................... 375/354; 327/202
(58) Field of Search ................................ 375/354, 356, 375/377; 327/202, 411, 427

(56) References Cited

U.S. PATENT DOCUMENTS 5,548,620 A * 8/1996 Rogers ....................... 375/354
5,576,651 A * 11/1996 Phillips ...................... 327/202
5,793,227 A * 8/1998 Goldrian ..................... 326/94

* cited by examiner

Primary Examiner—Kevin M Burd

(57) ABSTRACT

The present invention provides a synchronizer for receiving an incoming data signal of a first clock domain and for outputting a data signal of a second clock domain. The synchronizer comprises an input stage, a master latch, a transfer stage and a slave latch. The input stage receives the data signal of the first clock domain and outputs the data signal to the master latch when the input stage is clocked with a master clock signal. The master latch stores the data signal at a storage node of the master latch. The master latch has a resolve time associated with it during which the master latch seeks to resolve the data signal to a logic 0 or a logic 1. The transfer stage transfers the data signal stored in the master latch to the slave latch when the transfer stage is clocked with a slave clock signal.

14 Claims, 2 Drawing Sheets

SCANNABLE SYNCHRONIZER HAVING A DECEASED RESOLVING TIME

TECHNICAL FIELD OF THE INVENTION

The present invention relates generally to synchronizers and, more particularly, to a scannable synchronizer having an improved design that enables the resolving time associated with the synchronizer to be decreased and that decreases the likelihood that a synchronizer failure will occur.

BACKGROUND OF THE INVENTION

Synchronizers receive data from upstream logic in one clock domain and synchronize that data to another clock domain associated with logic downstream of the synchronizer. The synchronizer ensures that the data coming out of the synchronizer will not violate the setup or hold constraints of clocked elements located downstream of the synchronizer. During synchronization, it is possible for the incoming data to violate the setup or hold constraints of the synchronizer itself, and thereby cause a meta-stable condition to occur in the synchronizer. The amount of time that it takes for the synchronizer to exit this meta-stable state and move towards a valid state is commonly referred to as the resolving time of the synchronizer. It is desirable to minimize the resolving time of the synchronizer so that the speed of the synchronizer can be maximized and so that the possibility of a synchronizer failure occurring can be minimized.

FIG. 1 is a schematic diagram of a synchronizer that is currently used in integrated circuits. The synchronizer 1 comprises a master latch 2 and a slave latch 3. The master latch 2 and the slave latch 3 both have resolving times associated with them. Generally, the master latch 2 is allowed to use one-half of the clock cycle to resolve an incoming value of the data, D, and the slave latch 3 is allowed to use the second half of the clock cycle to resolve the signal received from the master latch. During a single clock cycle, the data D is transferred into the master latch 2, is transferred from the master latch 2 to the slave latch 3 and is output as output Q from the slave latch 3 for use by logic located downstream of the synchronizer 1.

A synchronizer failure occurs when the functions performed by the master latch 2 and the slave latch 3 fail to resolve the value of the data D to a logic 0 or 1 by the end of the clock cycle. If the output Q has not been resolved to a 1 or a 0 by the end of the clock cycle, the downstream logic will receive a value that is between a logic 0 and a logic 1 and this intermediate value may be erroneously interpreted by the downstream logic. Therefore, it is crucial to minimize the likelihood of a synchronizer failure occurring.

FIG. 2 illustrates a timing diagram of the wave forms of the clock signals M1 and S1 of the master latch 2 and slave latch 3, respectively. The clock signals M1 and S1 are inverses of one another. For a positive edge-triggered synchronizer, the clock signal S1 is the clock directly and the clock signal M1 is the clock inverted. Thus, the output Q will change on the rising edge of the clock, which is when the transfer gate T4 turns on and allows the value on node MAS of the master latch 2 to be transferred to the slave latch 3. As shown in FIG. 2, S1 goes low just before M1 goes high. If M1 were to go high while S1 was high, the value of the data signal D would simply pass through the synchronizer 1 without waiting for the clock to change, and the data would not be synchronized to the new clock domain.

During normal operation, when M1 is high, the transfer gate T1 is turned on and the data signal D is passed to the storage node SN1. The data signal D passes through a forward inverter I2 and then through a feedback inverter I3 to the storage node SN1. The inverter I3 provides a small amount of gain sufficient to hold the value of the signal on the storage node SN1. When M1 goes low, T3 turns on and another feedback inverter, 11, which is a relatively strong feedback inverter, provides additional gain to the signal fed back to the storage node SN1. This additional gain serves to drive the value of the signal on node SN1 during the period when M1 is low and is not driving the data signal.

S1 goes high when M1 goes low, thereby turning gate T4 on, and the signal on node MAS is transferred into the slave latch 3. While S1 is high and M1 is low, the master latch 2 is attempting to resolve the value on node SN1 to a 1 or a 0. The signal on node SN2 passes through forward inverter 15 and is fed back through feedback inverter 16 to the storage node SN2. Both of these inverters apply gain to the signal. The gain provided by inverter 16 holds the value on node SN2. When S1 goes low, gate T5 is turned on and feedback inverter 14 feeds back the signal from node SLV to node SN2, while providing additional gain to the signal.

In the master latch 2, the gain provided by the feedback inverters I1 and I3 and the gain provided by the forward inverter I2 facilitate the resolving process by helping to drive the values on nodes SN1 and MAS to a 0 or a 1. Likewise, the inverters I4, I5 and I6 of the slave latch 3 provide gain that helps to drive the values on nodes SN2 and SLV to a 1 or a 0. If the value of the data D is transitioning near the time when M1 goes low, a meta-stable state can occur in the master latch 2. A particular value exists between 0 and 1 that will cause the master latch 2 to be put in a meta-stable state if transistor T1 is turned off at the time that the particular value is on node SN1.

If this meta-stable state has not been resolved by the time that S1 goes low, then the slave latch 3 will attempt to resolve this meta-stable condition. The amount of time that it takes the master latch 2 to begin driving the value on node SN1 toward a logic 0 or 1 from the meta-stable value is known as the resolving time of the master latch 2. Typically, the resolving time is viewed as the amount of time that it takes for the voltage on node SN1 to change by a factor of e, which is a well known constant having a value of 2.718.

The probability that a meta-stable value will be output from the synchronizer 1 at output Q is a function of several factors. As stated above, the master latch 2 has one-half of the clock cycle (i.e., while S1 is high) to resolve the value of D to a 0 or 1 because the value should be resolved by the time that the slave latch 3 is turned off. Similarly, the slave latch 3 has one-half of the clock cycle (i.e., while S1 is low) to resolve the value on node SN2 because the value output at Q should be resolved to a 1 or a 0 by the end of the clock cycle if the synchronizer is driving directly into another register. If additional logic exists between the synchronizer and the next register, then the time it takes to pass through that logic will need to be subtracted from the time that the slave latch has to resolve.

Although the design of the synchronizer 1 shown in FIG. 1 generally has a good resolving time associated with it, it would be desirable to provide an improved synchronizer design that would further reduce the resolving time and that would minimize the likelihood of a synchronizer failure occurring. One of the disadvantages associated with the synchronizer 1 is that when S1 goes high and M1 goes low, node MAS of the master latch 2 sees the capacitance associated with node SN2 of the slave latch 3. Since the master latch 2 is resolving when M1 is low and S1 is high, the capacitance on node SN2 that is seen by node MAS limits the resolving speed of the master latch 2. The capacitance on node SN2 is the capacitance associated with gate T5 and with inverters 15, 16 and 17. This total capacitance is relatively large and significantly limits the speed with which the master latch 2 can resolve to a 0 or a 1.

Another disadvantage of the synchronizer 1 shown in FIG. 1 is that the input stage T1 of the master latch 2 and the input stage T4 of the slave latch 3 provide no gain to the signals being input to these latches. Consequently, these input stages do not reduce the probability that the latches will see a meta-stable value on their storage nodes.

Another disadvantage of the design of the synchronizer 1 shown in FIG. 1 is that, during testing of the synchronizer 1, both of the feedback inverters I1 and I3 of the master latch 2 must be overdriven by the transfer gate T2. During testing of the synchronizer 1, data is scanned into the synchronizer 1 via a serial test port, which is represented by SCANNIN in FIG. 1. A plurality of synchronizers are connected together to form a shift register by connecting the output Q of each synchronizer to the SCANNIN input of another synchronizer. The SHIFT signal is then utilized to control the transfer gate T2 in order to allow data to be shifted into the master latch 2. Logic (not shown) coupled to gate T4 controls the shifting of the data from the master latch 2 to the slave latch 3.

Essentially, the SHIFT signal and the signal being used to control the gate T4 are alternatively toggled in order to shift the data into the master latch during the first half of the shift cycle and to shift the data into the slave latch during the second half of the shift cycle. A test signal is used to force M1 low so that transfer gate T1 is turned off during testing. Since gate T3 is controlled by M1 inverted, gate T3 is turned on during testing, thereby rendering inverter I1 operational. Consequently, both of the feedback inverters I1 and I3 must be overdriven by gate T2 during testing, which requires that the gate T2 be sufficiently large to overdrive these inverters. However, making gate T2 large increases the capacitance on node SN1 of the master latch 2, which, in turn, limits the speed with which the master latch 2 can resolve the data signal D to a 0 or a 1.

Accordingly, a need exists for a synchronizer that overcomes the limitations associated with the synchronizer 1 shown in FIG. 1 and that has improved resolving ability in terms of both an increased resolving speed and a decreased likelihood that a synchronizer failure will occur.

SUMMARY OF THE INVENTION

The present invention provides a synchronizer for receiving an incoming data signal of a first clock domain and for outputting a data signal of a second clock domain. The synchronizer comprises an input stage, a master latch, a transfer stage and a slave latch. The input stage and/or the transfer stage comprise a clocked inverter. The input stage receives the data signal of the first clock domain and outputs the data signal therefrom when the input stage is clocked with a master clock signal. The master latch receives the data signal output from the input stage and stores the data signal at a storage node of the master latch. The master latch has a resolve time associated therewith during which the master latch seeks to resolve the data signal to a logic 0 or a logic 1. The transfer logic causes the data signal stored in the master latch to be transferred out of the master latch and into the slave latch when the transfer logic is clocked with a slave clock signal.

Preferably, both the input stage and the transfer stage comprise a clocked inverter. The clocked inverter of the input stage provides gain to the input data signal that decreases the transition time of the input data signal and thereby decreases the possibility that the master latch will enter a meta-stable state, i.e., a state that the master latch must exit to begin driving the data signal to a 0 or a 1. The clocked inverter of the transfer stage provides gain to the signal being transferred from the master latch into the slave latch that decreases the possibility that the slave latch will enter a meta-stable state when the data signal output to the slave latch from the master latch has not already been resolved to a 0 or a 1 by the master latch.

The clocked inverter of the transfer stage also serves to isolate the master latch from the capacitance associated with the inverters of the slave latch during the portion of the clock cycle in which the master latch is attempting to resolve the data signal to a 0 or a 1. By isolating the master latch from this capacitance, the resolving time associated with the master latch is decreased.

These features of the present invention reduce the resolving time of the synchronizer and minimize the likelihood that a synchronizer failure will occur. These and other features and advantages of the present invention will become apparent from the following description, drawings and claims.

DETAILED DESCRIPTION OF THE INVENTION

Figure 3:
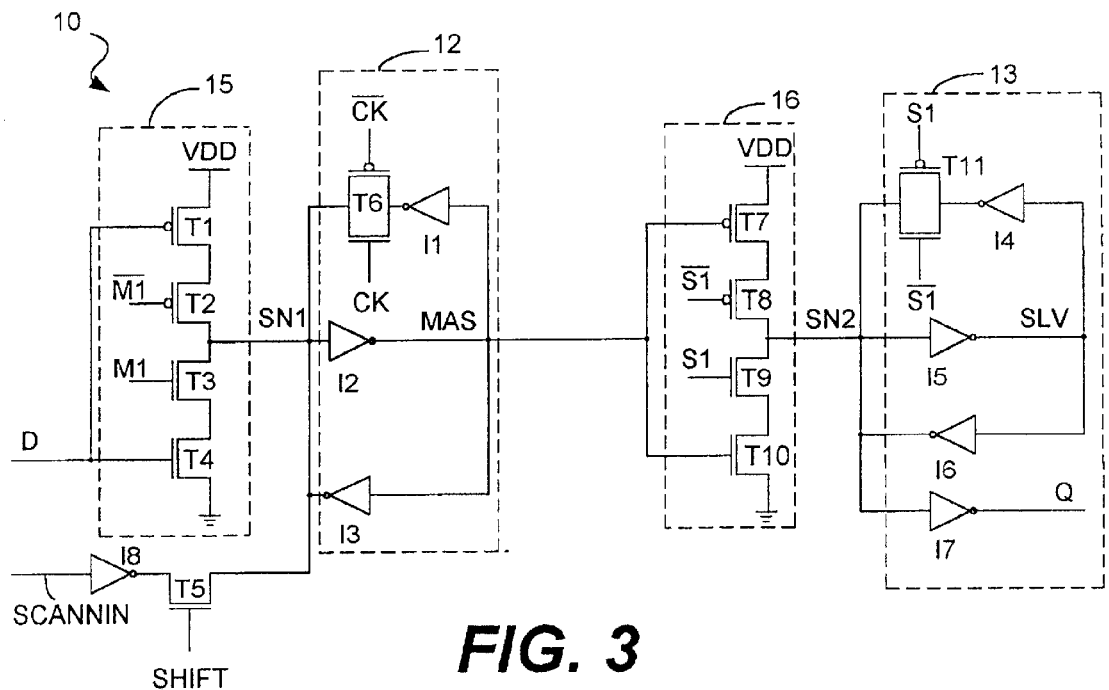
FIG. 3 is a schematic diagram of the synchronizer of the present invention in accordance with the preferred embodiment.

FIG. 3 is a schematic diagram of the synchronizer 10 of the present invention in accordance with the preferred embodiment. The synchronizer 10 comprises a master latch 12 and a slave latch 13. The master and slave latches 12 and 13 operate in a manner that is substantially identical to the manner in which the master and slave latches 2 and 3, respectively, shown in FIG. 1 operate. However, the synchronizer 10 of the present invention utilizes an input stage 15 to the master latch 12 and an input stage 16 to the slave latch 13 that are clocked inverters that facilitate the resolving processes performed by the master and slave latches 12 and 13, as described below in more detail. Therefore, the input stages 15 and 16 improve the resolving time of the synchronizer 10 and minimize the likelihood that a synchronizer failure will occur.

Figure 1:
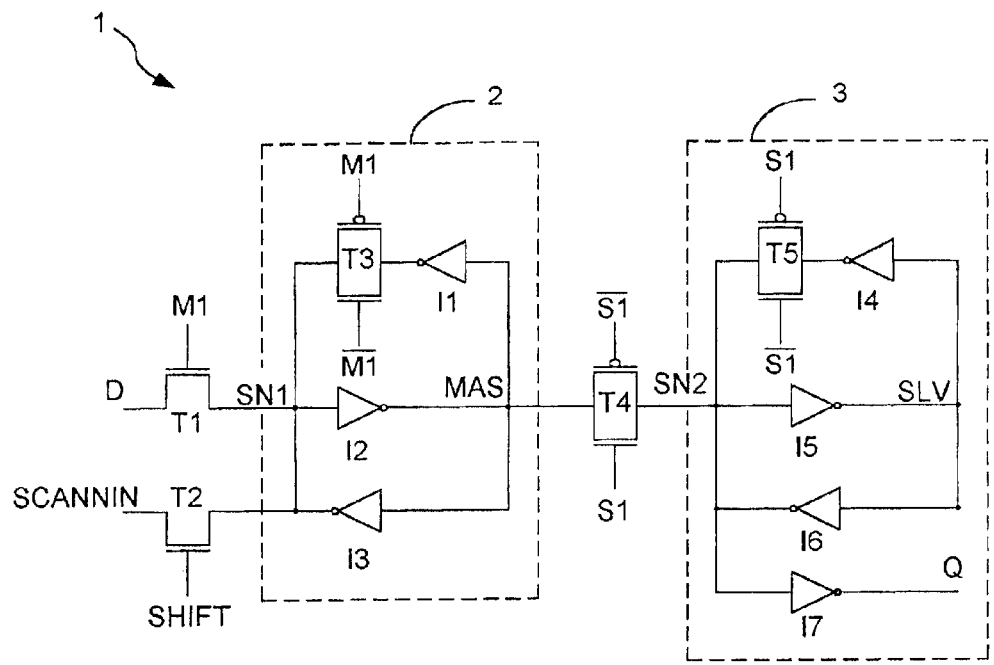
FIG. 1 is a schematic diagram of a synchronizer that is currently used to map incoming data from one clock domain to another clock domain.

Another difference between the synchronizer 10 of the present invention and the synchronizer 1 shown in FIG. 1 is that the gate T6 is not controlled by M1, but is controlled by another signal CK, which is independent of M1. Therefore, during testing, the inverter I1 can be isolated so that the transfer gate T5 is only required to overdrive the weak feedback inverter I3. This feature of the present invention, which will be described below in more detail, enables the size of the transfer gate T5 to be relatively small. Consequently, the capacitance associated with the transfer gate T5 that is seen by node SN1 will be relatively small, which enhances the ability of the master latch 12 to have a decreased resolving time.

It should be noted that each of these differences between the synchronizer 1 shown in FIG. 1 and the synchronizer 10 shown in FIG. 3 provides the synchronizer 10 with associated benefits and advantages over the synchronizer 1. It is not necessary that the synchronizer of the present invention comprise all of these differences. Rather, the synchronizer of the present invention may comprise one or more of these differences. For example, it is not necessary that both of the input stages 15 and 16 of the synchronizer 10 be comprised of clocked inverters. Comprising one of these stages of a clocked inverter and the other of these stages with logic of, for example, the type shown in FIG. 1 also provides the synchronizer of the present invention with additional benefits that are not realized by the synchronizer shown in FIG. 1.

Similarly, using an independent clock signal CK, rather than M1, to control gate T6 while using, for example, the gates T1 and T4 as the input stages of the master and slave latches 2 and 3, respectively, also provides the synchronizer of the present invention with benefits that are not realized by the synchronizer 1 shown in FIG. 1. Therefore, although the present invention is described below with reference to FIG. 3, which shows a synchronizer that simultaneously incorporates all of these features, those skilled in the art will understand that the synchronizer of the present invention comprises one or more of these features. Furthermore, those skilled in the art will understand that other variations to the embodiment of the synchronizer 10 shown in FIG. 3 may be made that are also within the scope of the present invention.

Figure 2:
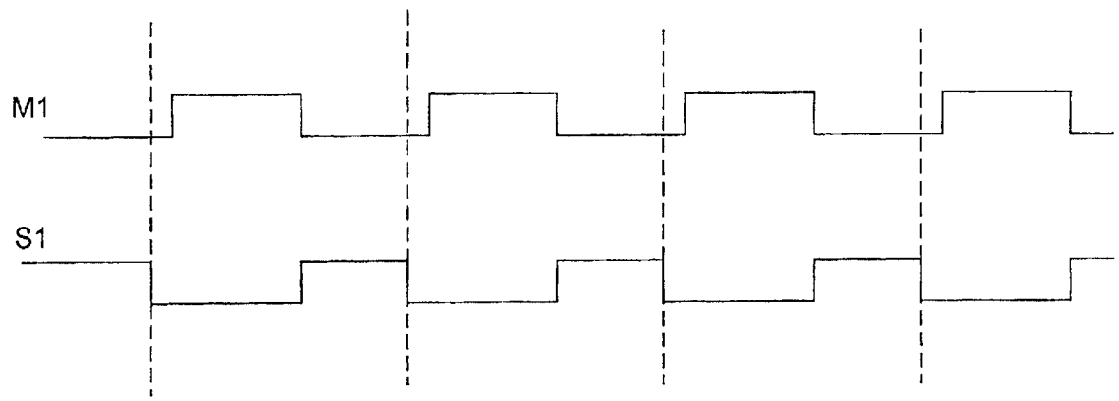
FIG. 2 is a timing diagram of clock signals utilized by the master and slave latches of the synchronizer shown in FIG. 1.
Figure 4:
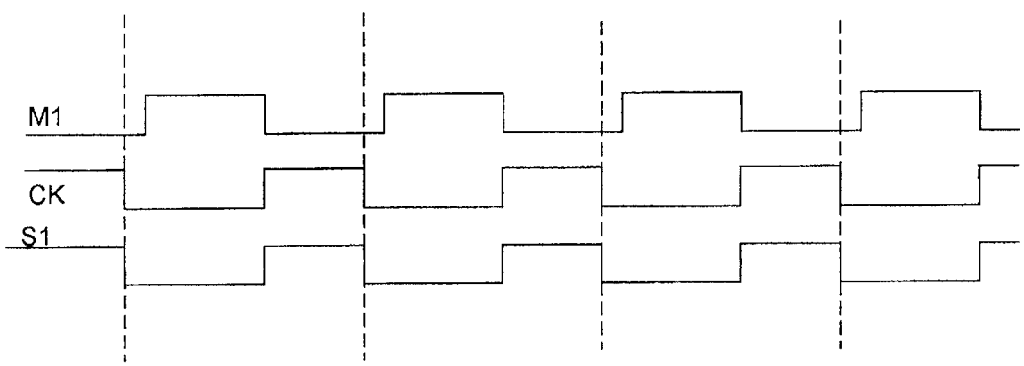
FIG. 4 is a timing diagram of the clock signals utilized by the master and slave latches of the synchronizer shown in FIG. 3.

In the interest of brevity, only the preferred embodiment of the present invention, which incorporates all of the aforementioned features, which are shown in FIG. 3, will be discussed herein. FIG. 4 illustrates the relative timing of the clock signals M1, S1 and CK utilized by the synchronizer 10. The timing of the clock signals M1 and S1 shown in FIG. 4 is identical to the timing of the clock signals M1 and S1 shown in FIG. 2. The clock signal CK, which controls gate T6, is the inverse of clock signal M1 during the normal mode of operations. The operations of the synchronizer of the present invention will now be described with reference to FIGS. 3 and 4.

The input stage 15 of the master latch I2 is a clocked inverter comprising P field effect transistors (PFETs) T1 and T2 and N field effect transistors (NFETs) T3 and T4. The clocked inverter replaces the transfer gate T1 of the synchronizer 1 shown in FIG. 1. When M1 is high and the data signal D is high, transistors T3 and T4 are on and the value on node SN1 will be pulled down to ground. When the signal M1 is high and the data signal D is low, transistors T1 and T2 are on and the value on node SN1 will be pulled up to VDD. Therefore, the clocked inverter of the input stage 15 transfers the inverse of signal D to node SN1 on the rising edge of the clock signal M1.

As discussed above with reference to FIG. 1, the feedback inverters I1 and I3 provide gain that facilitates the resolving process in the latches. The inverter I3 provides a relatively small amount of gain that is sufficient to hold the value on node SN1 when the signal M1 is high and is driving node SN1 or when shifting. In contrast, inverter I1 provides a relatively large amount of gain when gate T6 is on, which is when M1 is low and is no longer driving node SN1. The signal CK is the inverse of signal M1, as shown in FIG. 4. When signal M1 is low and signal CK is high, gate T6 turns on and inverter I1 feeds back the signal on node MAS to node SN1.

The clock signal S1 of the slave latch I3 goes high when the signal M1 goes low. When the signal S1 goes high, the value on node MAS of the master latch 12 is transferred to node SN2 of the slave latch 13. When clock signal S1 goes low, gate T11 is turned on and inverter 14 feeds back the signal on node SLV to node SN2. When the signal S1 is low, the slave latch 13 is resolving the value on node SN2. When the signal S1 is high, the master latch 12 is resolving the value on node SN1.

In accordance with the present invention, it has been determined that using the clocked inverters of the input stages 15 and 16, respectively, provides additional gain that further facilitates the resolving process and decreases the resolving time. Also, the gain provided by the input stage 15 decreases the transitioning time of the data signal D, which, in turn, reduces the possibility that a meta-stable state will occur in the master latch 12, as discussed below in more detail. Furthermore, by using a clocked inverter in the input stage 16 of the slave latch 13, the amount of capacitance on node SN2 of the slave latch 13 that is seen by node MAS of the master latch 12 is decreased, which enhances the ability of the master latch 12 to decrease the resolving time of the master latch 12.

As stated above, it is only possible for the master latch 12 to enter a meta-stable state if the data signal D is at a particular value when the input stage 15 is turned off, i.e., when the signal M1 goes low. The clocked inverter of the input stage 15 provides gain that decreases the transition time of the data signal D, which decreases the likelihood that the data signal D will be at the value that causes a meta-stable state to occur when M1 goes low. The clocked inverter of transfer stage 16 provides gain that decreases the chance that a meta-stable state value on node MAS will be transferred to storage node SN2 and will still constitute a meta-stable value for the slave latch.

With respect to the input stage 16 of the slave latch 13, the node MAS of the master latch 12 will only see the capacitance associated with transistors T7 and T10 of the slave latch input stage 16. This is a significant improvement over the design of the synchronizer 1 shown in FIG. 1. With the synchronizer 1 shown in FIG. 1, when the signal S1 is high and the signal M1 is low, gate T4 is turned on and node MAS sees the capacitance associated with gate T5 and with inverters I5, I6 and I7. In contrast, during this same time period, which is when the master latch is resolving, the node MAS of the master latch 12 shown in FIG. 3 only sees the capacitance associated with FETS T7 and T10, which is significantly less than that associated with gate T6 and with inverters I5, I6 and I7. This reduction in the amount of capacitance seen by node MAS reduces the resolving time of the master latch 12.

Another advantage of the synchronizer 10 shown in FIG. 3 relates to testing the synchronizer 10. As stated above, during testing of the synchronizer 10, the signal M1 is driven low and data on input SCANNIN is shifted into the master latch 12 through the transfer gate T5, which is controlled by a SHIFT signal. As stated above, in the design shown in FIG. 1, the transfer gate T3 is controlled by the signal M1. Therefore, when the synchronizer 1 of FIG. 1 is in the testing mode, the gate T1 is turned off and the gate T3 is turned on, which renders the inverter I1 operational. Therefore, the gate T2 is required to over drive both of the inverters I1 and I3 in order to shift the SCANNIN data into the master latch 2. The gate T2 must be relatively large to provide it with sufficient strength to over drive these inverters. Making the gate T2 relatively large means that the capacitance associated with the gate T2 and seen by node SN1 also will be large, which increases the resolve time of the master latch.

As shown in FIG. 3, the gate T6 is no longer controlled by the signal M1 during the test mode. Rather, the gate T6 is controlled by another clock signal, CK, which is the inverse of M1 during normal operations. Therefore, when M1 is driven low during the test mode, the gate T6 is not turned on because CK remains low. In accordance with the present invention, during the test mode, M1 and CK are both driven low. As a result, inverter I1 is not operational during the testing mode. Consequently, it is only necessary for gate T5 to overdrive weak inverter I3. Therefore, the gate T5 can be relatively small in size, thereby enabling the capacitance associated with gate T5 to be reduced. Therefore, the capacitance seen by node SN1 is relatively small and the resolving time of the master latch 12 is decreased.

It should be noted that the synchronizer 10 has been described with reference to the preferred embodiment and that the synchronizer 10 is not limited to this embodiment. Modifications may be made to the embodiment shown in FIG. 3 and discussed above without deviating from the sprit and scope of the present invention. For example, it is well known to replace certain logic gates with other logic gates that, although physically different, provide a logically equivalent result. For example, it is well known that a NAND gate is logically equivalent to an AND gate followed by an inverter gate. Those skilled in the art will understand that the synchronizer 10 shown in FIG. 3 could be modified in such a manner and that all such modifications are within the scope of the present invention. Those skilled in the art will understand that other types of modifications may be made to the synchronizer 10 shown in FIG. 3 that are within the scope of the present invention.

What is claimed is:

1. A synchronizer for receiving an incoming data signal of a first clock domain and for outputting a resolved data signal of a second clock domain, the synchronizer comprising:

an input stage, the input stage receiving the incoming data signal of the first clock domain, the input stage comprising a clocked inverter, the input stage outputting an inverted data signal therefrom when the clocked inverter is clocked with a master clock signal M1;

a master latch coupled to the input stage, the master latch receiving the inverted data signal output from the input stage and storing the inverted data signal at a storage node of the master latch, the master latch having a resolve time associated therewith during which the master latch seeks to resolve the inverted data signal to a logic 0 or a logic 1;

transfer logic coupled to the master latch, the transfer logic causing the signal stored in the master latch to be transferred out of the master latch when the transfer logic is clocked with a slave clock signal S1; and a slave latch coupled to the transfer logic, the signal transferred out of the master latch being transferred into the slave latch, the slave latch comprising an output terminal for outputting the resolved data signal of the second clock domain;

wherein the master latch comprises:

a first feedback inverter having an input terminal and an output terminal, the input terminal of the first feedback inverter being coupled to an output node of the master latch; and a transmission gate being coupled on a first side of the transmission gate to the output terminal of the first feedback inverter, the transmission gate being coupled on a second side of the transmission gate to the storage node of the master latch, the transmission gate being controlled by a transmission gate clock signal CK, which is independent of the master clock signal M1 and is substantially the inverse of the master clock signal M1.

2. The synchronizer of claim 1, wherein the clocked inverter comprised by the input stage has a gain associated therewith and wherein the gain of the clocked inverter of the input stage reduces the likelihood that the data signal input to the master latch will have a value that places the master latch in a meta-stable state.

3. The synchronizer of claim 2, wherein the transfer logic is a transfer stage comprising a clocked inverter, the clocked inverter of the transfer stage transferring a data signal out of the master latch and into the slave latch when the clocked inverter of the transfer stage is clocked with the slave clock signal S1, and wherein the clocked inverter of the transfer stage isolates the master latch from the slave latch while the master latch is seeking to resolve the data signal input to the master latch to a logic 0 or a logic 1.

4. A synchronizer for receiving an incoming data signal of a first clock domain and for outputting a resolved data signal of a second clock domain, the synchronizer comprising:

input logic, the input logic receiving the incoming data signal of the first clock domain, the input logic outputting an inverted data signal therefrom when the input logic is clocked with a master clock signal M1;

a master latch coupled to the input logic, the master latch receiving the inverted data signal output by the input logic and storing the inverted data signal at a storage node of the master latch, the master latch having a resolve time associated therewith during which the master latch seeks to resolve the inverted data signal to a logic 0 or a logic 1;

a transfer stage coupled to the master latch, the transfer stage comprising a clocked inverter, the transfer stage causing the signal stored in the master latch to be transferred out of the master latch when the clocked inverter of the transfer stage is clocked with a slave clock signal S1; and a slave latch coupled to the transfer stage, the signal transferred out of the master latch being transferred into the slave latch, the slave latch comprising an output terminal for outputting the resolved data signal of the second clock domain;

wherein the master latch comprises:

a first feedback inverter having an input terminal and an output terminal, the input terminal of the first feedback inverter being coupled to an output node of the master latch; and a transmission gate being coupled on a first side of the transmission gate to the output terminal of the first feedback inverter, the transmission gate being coupled on a second side of the transmission gate to the storage node of the master latch, the transmission gate being controlled by a transmission gate clock signal CK, which is independent of the master clock signal M1 and is substantially the inverse of the master clock signal M1.

5. The synchronizer of claim 4, wherein the clocked inverter of the transfer stage isolates the master latch from the slave latch while the master latch is seeking to resolve the data signal stored in the master latch to a logic 0 or a logic 1.

6. The synchronizer of claim 4, wherein the clocked inverter comprised by the transfer stage has a gain associated therewith and wherein the gain of the clocked inverter of the transfer stage reduces the likelihood that the data signal input to the slave latch will not resolve to a logic 0 or a logic 1.

7. A synchronizer for receiving an incoming data signal of a first clock domain and for outputting a resolved data signal of a second clock domain, the synchronizer comprising:

an input stage, the input stage receiving the incoming data signal of the first clock domain, the input stage comprising a clocked inverter, the input stage outputting an inverted data signal therefrom when the clocked inverter is clocked with a master clock signal M1;

a master latch coupled to the input stage, the master latch receiving the inverted data signal output from the input stage and storing the inverted data signal at a storage node of the master latch, the master latch having a resolve time associated therewith during which the master latch seeks to resolve the inverted data signal to a logic 0 or a logic 1;

transfer logic coupled to the master latch, the transfer logic causing the signal stored in the master latch to be transferred out of the master latch when the transfer logic is clocked with a slave clock signal S1; and a slave latch coupled to the transfer logic, the signal transferred out of the master latch being transferred into the slave latch, the slave latch comprising an output terminal for outputting the resolved data signal of the second clock domain;

wherein the master latch comprises:
  a forward inverter, the forward inverter comprising an input terminal and an output terminal, the input terminal of the forward inverter being coupled to the storage node of the master latch, the output terminal of the forward inverter being coupled to an output node of the master latch, the output node of the master latch being coupled to the transfer logic;
  a first feedback inverter having an input terminal and an output terminal, the input terminal of the first feedback inverter being coupled to the output node of the master latch;
  a transmission gate being coupled on a first side of the transmission gate to the output terminal of the first feedback inverter, the transmission gate being coupled on a second side of the transmission gate to the storage node of the master latch, the transmission gate being controlled by a transmission gate clock signal CK, which is independent of the master clock signal M1 and is substantially the inverse of the master clock signal M1;
  a second feedback inverter having an input terminal and an output terminal, the input terminal of the second feedback inverter being coupled to the output node of the master latch, the output terminal of the second feedback inverter being coupled to the storage node of the master latch; and
  a transfer gate having a gate terminal, an input terminal and an output terminal, the output terminal of the transfer gate being connected to the storage node of the master latch, the input terminal of the transfer gate being connected to a test port of the synchronizer, the transfer gate controlling a transfer of test data received at the test port into the master latch, the gate terminal of the transfer gate being coupled to a shift control signal that is capable of turning the transfer gate on and off for controlling the transfer of data from the test port into the master latch, wherein when the shift control signal turns the transfer gate on, said transmission gate clock signal CK turns said transmission gate off such that the first feedback inverter is inoperative.

8. A synchronizer for receiving an incoming data signal of a first clock domain and for outputting a resolved data signal of a second clock domain, the synchronizer comprising:

an input stage, the input stage receiving the incoming data signal of the first clock domain, the input stage comprising a clocked inverter, the input stage outputting an inverted data signal therefrom when the clocked inverter is clocked with a master clock signal M1;

a master latch coupled to the input stage, the master latch receiving the inverted data signal output from the input stage and storing the inverted data signal at a storage node of the master latch, the master latch having a resolve time associated therewith during which the master latch seeks to resolve the inverted data signal to a logic 0 or a logic 1;

transfer logic coupled to the master latch, the transfer logic causing the signal stored in the master latch to be transferred out of the master latch when the transfer logic is clocked with a slave clock signal S1; and a slave latch coupled to the transfer logic, the signal transferred out of the master latch being transferred into the slave latch, the slave latch comprising an output terminal for outputting the resolved data signal the second clock domain;

wherein the clocked inverter comprised by the input stage has a gain associated therewith and wherein the gain of the clocked inverter of the input stage reduces the likelihood that the data signal input to the master latch will have a value that places the master latch in a meta-stable state;

wherein the clocked inverter comprised by the input stage comprises two P field effect transistors (PFETs) and two N field effect transistors (NFETs), each of the PFETs and NFETs having a gate terminal, a first channel terminal and a second channel terminal, the first channel terminal of a first one of the PFETs being connected to a supply voltage, the first channel terminal of a second one of the PFETs being connected to the second channel terminal of the first PFET, the first channel terminal of a first one of the NFETs being connected to the second channel terminal of the second PFET, the first channel terminal of a second one of the NFETs being connected to the second channel terminal of the first NFET, the second channel terminal of the second NFET being connected to ground, the data signal received by the input stage being applied to the gate terminals of the first PFET and the second NFET, the master clock signal being applied to the gate terminal of the first NFET, an inverse of the master clock signal being applied to a gate terminal of the second PFET, the storage node of the master latch corresponding to the connection between the second PFET and the first NFET; and wherein the master latch comprises:
  a first feedback inverter having an input terminal and an output terminal, the input terminal of the first feedback inverter being coupled to an output node of the master latch; and a transmission gate being coupled on a first side of the transmission gate to the output terminal of the first feedback inverter, the transmission gate being coupled on a second side of the transmission gate to the storage node of the master latch, the transmission gate being controlled by a transmission gate clock signal CK, which is independent of the master clock signal M1 and is substantially the inverse of the master clock signal M1.

9. A synchronizer for receiving an incoming data signal of a first clock domain and for outputting a resolved data signal of a second clock domain, the synchronizer comprising:
   an input stage, the input stage receiving the incoming data signal of the first clock domain, the input stage comprising a clocked inverter, the input stage outputting an inverted data signal therefrom when the clocked inverter is clocked with a master clock signal M1;
   a master latch coupled to the input stage, the master latch receiving the inverted data signal output from the input stage and storing the inverted data signal at a storage node of the master latch, the master latch having a resolve time associated therewith during which the master latch seeks to resolve the inverted data signal to a logic 0 or a logic 1;
   transfer logic coupled to the master latch, the transfer logic causing the signal stored in the master latch to be transferred out of the master latch when the transfer logic is clocked with a slave clock signal S1; and
   a slave latch coupled to the transfer logic, the signal transferred out of the master latch being transferred into the slave latch, the slave latch comprising an output terminal for outputting the resolved data signal of the second clock domain;
   wherein the clocked inverter comprised by the input stage has a gain associated therewith and wherein the gain of the clocked inverter of the input stage reduces the likelihood that the data signal input to the master latch will have a value that places the master latch in a meta-stable state;
   wherein the transfer logic is a transfer stage comprising a clocked inverter, the clocked inverter of the transfer stage transferring a data signal out of the master latch and into the slave latch when the clocked inverter of the transfer stage is clocked with the slave clock signal S1, and wherein the clocked inverter of the transfer stage isolates the master latch from the slave latch while the master latch is seeking to resolve the data signal input to the master latch to a logic 0 or a logic 1; and
   wherein the clocked inverter of the transfer stage comprises two P field effect transistors (PFETs) and two N field effect transistors (NFETs), each of the PFETs and NFETs having a gate terminal, a first channel terminal and a second channel terminal, the first channel terminal of a first one of the PFETs being connected to a supply voltage, the first channel terminal of a second one of the PFETs being connected to the second channel terminal of the first PFET, the first channel terminal of a first one of the NFETs being connected to the second channel terminal of the second PFET, the first channel terminal of a second one of the NFETs being connected to the second channel terminal of the first NFET, the second channel terminal of the second NFET being connected to ground, the data signal received by the transfer stage being applied to the gate terminals of the first PFET and the second NFET, the slave clock signal being applied to the gate terminal of the first NFET, an inverse of the slave clock signal being applied to a gate terminal of the second PFET, the storage node of the slave latch corresponding to the connection between the second PFET and the first NFET; and
   wherein the master latch comprises:
      a first feedback inverter having an input terminal and an output terminal, the input terminal of the first feedback inverter being coupled to an output node of the master latch; and
      a transmission gate being coupled on a first side of the transmission gate to the output terminal of the first feedback inverter, the transmission gate being coupled on a second side of the transmission gate to the storage node of the master latch, the transmission gate being controlled by a transmission gate clock signal CK, which is independent of the master clock signal M1 and is substantially the inverse of the master clock signal M1.

10. The synchronizer of claim 9, wherein the slave latch comprises:
    a first forward inverter, the first forward inverter comprising an input terminal and an output terminal, the input terminal of the first forward inverter being coupled to a storage node of the slave latch;
    a first feedback inverter having an input terminal and an output terminal, the input terminal of the first feedback inverter being coupled to the output terminal of the first forward inverter;
    a transmission gate being coupled on a first side of the transmission gate to the output terminal of the first feedback inverter, the transmission gate being coupled on a second side of the transmission gate to the storage node of the slave latch, the transmission gate being controlled by the slave clock signal S1;
    a second feedback inverter having an input terminal and an output terminal, the input terminal of the second feedback inverter being coupled to the output terminal of the first forward inverter, the output terminal of the second feedback inverter being coupled to the storage node of the slave latch; and
    second forward inverter having an input terminal and an output terminal, the input terminal of the second forward inverter being coupled to the storage node of the slave latch, the output terminal of the second forward inverter corresponding to the output terminal of the synchronizer slave latch.

11. A synchronizer for receiving an incoming data signal of a first clock domain and for outputting a resolved data signal of a second clock domain, the synchronizer comprising:
    input logic, the input logic receiving the incoming data signal of the first clock domain, the input logic outputting an inverted data signal therefrom when the input logic is clocked with a master clock signal M1;
    a master latch coupled to the input logic, the master latch receiving the inverted data signal output by the input logic and storing the inverted data signal at a storage node of the master latch, the master latch having a resolve time associated therewith during which the master latch seeks to resolve the inverted data signal to a logic 0 or a logic 1;
    a transfer stage coupled to the master latch, the transfer stage comprising a clocked inverter, the transfer stage causing the signal stored in the master latch to be transferred out of the master latch when the clocked inverter of the transfer stage is clocked with a slave clock signal S1; and a slave latch coupled to the transfer stage, the signal transferred out of the master latch being transferred into the slave latch, the slave latch comprising an output terminal for outputting the resolved data signal the second clock domain;

wherein the master latch comprises:
  a forward inverter, the forward inverter comprising an input terminal and an output terminal, the input terminal of the forward inverter being coupled to the storage node of the master latch, the output terminal of the forward inverter being coupled to an output node of the master latch, the output node of the master latch being coupled to the transfer stage;
  a first feedback inverter having an input terminal and an output terminal, the input terminal of the first feedback inverter being coupled to the output node of the master latch;
  a transmission gate being coupled on a first side of the transmission gate to the output terminal of the first feedback inverter, the transmission gate being coupled on a second side of the transmission gate to the storage node of the master latch, the transmission gate being controlled by a transmission gate clock signal CK, which is independent of the master clock signal M1 and is substantially the inverse of the master clock signal M1;
  a second feedback inverter having an input terminal and an output terminal, the input terminal of the second feedback inverter being coupled to the output node of the master latch, the output terminal of the second feedback inverter being coupled to the storage node of the master latch; and
  a transfer gate having a gate terminal, an input terminal and an output terminal, the output terminal of the transmission gate being connected to the storage node of the master latch, the input terminal of the transfer gate being connected to a test port of the synchronizer, the transfer gate controlling a transfer of test data received at the test port into the master latch, the gate terminal of the transfer gate being coupled to a shift control signal that is capable of turning the transfer gate on and off for controlling the transfer of data from the test port into the master latch, wherein when the shift control signal turns the transmission gate on, said transmission gate clock signal CK turns said transmission gate off such that the first feedback inverter is inoperative.

12. A synchronizer for receiving an incoming data signal of a first clock domain and for outputting a resolved data signal of a second clock domain, the synchronizer comprising:

input logic, the input logic receiving the incoming data signal of the first clock domain, the input logic outputting an inverted data signal therefrom when the input logic is clocked with a master clock signal M1;
  a master latch coupled to the input logic, the master latch receiving the inverted data signal output by the input logic and storing the inverted data signal at a storage node of the master latch, the master latch having a resolve time associated therewith during which the master latch seeks to resolve the inverted data signal to a logic 0 or a logic 1;
  a transfer stage coupled to the master latch, the transfer stage comprising a clocked inverter, the transfer stage causing the signal stored in the master latch to be transferred out of the master latch when the clocked inverter of the transfer stage is clocked with a slave clock signal S1; and
  a slave latch coupled to the transfer stage, the signal transferred out of the master latch being transferred into the slave latch, the slave latch comprising an output terminal for outputting the resolved data signal of the second clock domain;

wherein the slave latch comprises:
  a first forward inverter, the first forward inverter comprising an input terminal and an output terminal, the input terminal of the forward inverter being coupled to a storage node of the slave latch;
  a first feedback inverter having an input terminal and an output terminal, the input terminal of the first feedback inverter being coupled to the output terminal of the first forward inverter;
  a transmission gate being coupled on a first side of the transmission gate to the output terminal of the first feedback inverter, the transmission gate being coupled on a second side of the transmission gate to the storage node of the slave latch, the transmission gate being controlled by the slave clock signal S1;
  a second feedback inverter having an input terminal and an output terminal, the input terminal of the second feedback inverter being coupled to the output terminal of the first forward inverter, the output terminal of the second feedback inverter being coupled to the storage node of the slave latch; and
  a second forward inverter having an input terminal and an output terminal, the input terminal of the second forward inverter being coupled to the storage node of the slave latch, the output terminal of the second forward inverter corresponding to the output terminal of the slave latch; and wherein the master latch comprises:
  a first feedback inverter having an input terminal and an output terminal, the input terminal of the first feedback inverter being coupled to an output node of the master latch; and
  a transmission gate being coupled on a first side of the transmission gate to the output terminal of the first feedback inverter, the transmission gate being coupled on a second side of the transmission gate to the storage node of the master latch, the transmission gate being controlled by a transmission gate clock signal CK, which is independent of the master clock signal M1 and is substantially the inverse of the master clock signal M1.

13. A synchronizer for receiving an incoming data signal of a first clock domain and for outputting a resolved data signal of a second clock domain, the synchronizer comprising:

input logic, the input logic receiving the incoming data signal of the first clock domain, the input logic outputting an inverted data signal therefrom when the input logic is clocked with a master clock signal M1;
  a master latch coupled to the input logic, the master latch receiving the inverted data signal output by the input logic and storing the inverted data signal at a storage node of the master latch, the master latch having a resolve time associated therewith during which the master latch seeks to resolve the inverted data signal to a logic 0 or a logic 1;
  a transfer stage coupled to the master latch, the transfer stage comprising a clocked inverter, the transfer stage causing the signal stored in the master latch to be transferred out of the master latch when the clocked inverter of the transfer stage is clocked with a slave clock signal S1; and a slave latch coupled to the transfer stage, the signal transferred out of the master latch being transferred into the slave latch, the slave latch comprising an output terminal for outputting the resolved data signal of the second clock domain;

wherein the clocked inverter of the transfer stage comprises two P field effect transistors (PFETs) and two N field effect transistors (NFETs), each of the PFETs and NFETs having a gate terminal, a first channel terminal and a second channel terminal, the first channel terminal of a first one of the PFETs being connected to a supply voltage, the first channel terminal of a second one of the PFETs being connected to the second channel terminal of the first PFET, the first channel terminal of a first one of the NFETs being connected to the second channel terminal of the second PFET, the first channel terminal of a second one of the NFETs being connected to the second channel terminal of the first NFET, the second channel terminal of the second NFET being connected to ground, the data signal received by the transfer stage being applied to the gate terminals of the first PFET and the second NFET, the slave clock signal being applied to the gate terminal of the first NFET, an inverse of the slave clock signal being applied to a gate terminal of the second PFET, the storage node of the slave latch corresponding to the connection between the second PFET and the first NFET; and wherein the master latch comprises:
 a first feedback inverter having an input terminal and an output terminal, the input terminal of the first feedback inverter being coupled to an output node of the master latch; and
 a transmission gate being coupled on a first side of the transmission gate to the output terminal of the first feedback inverter, the transmission gate being coupled on a second side of the transmission gate to the storage node of the master latch, the transmission gate being controlled by a transmission gate clock signal CK, which is independent of the master clock signal M1 and is substantially the inverse of the master clock signal M1.

14. A synchronizer for receiving an incoming data signal of a first clock domain and for outputting a resolved data signal of a second clock domain, the synchronizer comprising:

input logic, the input logic receiving the incoming data signal of the first clock domain, the input logic outputting an inverted data signal therefrom when the input logic is clocked with a master clock signal M1;

a master latch coupled to the input logic, the master latch receiving the inverted data signal output by the input logic and storing the inverted data signal at a storage node of the master latch, the master latch having a resolve time associated therewith during which the master latch seeks to resolve the inverted data signal to a logic 0 or a logic 1;

a transfer stage coupled to the master latch, the transfer stage comprising a clocked inverter, the transfer stage causing the data signal stored in the master latch to be transferred out of the master latch when the clocked inverter of the transfer stage is clocked with a slave clock signal S1; and a slave latch coupled to the transfer stage, the signal transferred out of the master latch being transferred into the slave latch, the slave latch comprising an output terminal for outputting the resolved data signal of the second clock domain;

wherein the input logic comprises a field effect transistor (FET) having a gate terminal, a first channel terminal and a second channel terminal, the gate terminal of FET being connected to the master clock signal M1, the data signal received by the input logic being received at the first channel terminal of the FET, the second channel terminal of the FET being connected to the storage node of the master latch; and wherein the master latch comprises:
 a first feedback inverter having an input terminal and an output terminal, the input terminal of the first feedback inverter being coupled to an output node of the master latch; and
 a transmission gate being coupled on a first side of the transmission gate to the output terminal of the first feedback inverter, the transmission gate being coupled on a second side of the transmission gate to the storage node of the master latch, the transmission gate being controlled by a transmission gate clock signal CK, which is independent of the master clock signal M1 and is substantially the inverse of the master clock signal M1.

* * * * *